United States Patent [19]
Rubin et al.

[11] Patent Number: 5,158,618
[45] Date of Patent: Oct. 27, 1992

[54] PHOTOVOLTAIC CELLS FOR CONVERTING LIGHT ENERGY TO ELECTRIC ENERGY AND PHOTOELECTRIC BATTERY

[75] Inventors: Leoind B. Rubin; Alexandr S. Osipov; Jury G. Sizganov; Gennady G. Untila; Andrei L. Kharitonov; Alexandr T. Rakhimov, all of Moscow, U.S.S.R.

[73] Assignee: BioPhotonics, Inc.

[21] Appl. No.: 652,549

[22] Filed: Feb. 8, 1991

[30] Foreign Application Priority Data

Feb. 9, 1990 [EP] European Pat. Off. ........ 90102601.3

[51] Int. Cl.⁵ .................. H01L 31/05; H01L 31/0224
[52] U.S. Cl. ..................................... 136/244; 136/251; 136/256
[58] Field of Search ......................... 136/244, 256, 251

[56] References Cited

U.S. PATENT DOCUMENTS 3,982,964  9/1976  Lindmayer et al. ................. 136/256
3,996,067  12/1976  Broder ................................. 136/256
4,291,191  9/1981  Dahzberg ............................ 136/246

FOREIGN PATENT DOCUMENTS 59-115576  7/1984  Japan .................................... 136/256
1-206671  8/1989  Japan .................................... 136/256

Primary Examiner—Aaron Weisstuch
Attorney, Agent, or Firm—Dominik, Stein, Saccocio, Reese, Colitz & VanDerWall

[57] ABSTRACT

A solar photovoltaic cell with a conductive current collecting contacts embedded in a block of optical transparent polymer material between the semiconductor wafer and protective cover in such a manner that at least the section thereof which are in contact with the surface of the semiconductor wafer protrude from the polymer block. This provides for a reliable ohmic contact between the current collecting contacts and the semiconductor wafer. The disclosed geometry of the solar cell reduces the shadowing area of the semiconductor wafer by up to 90%.

21 Claims, 5 Drawing Sheets

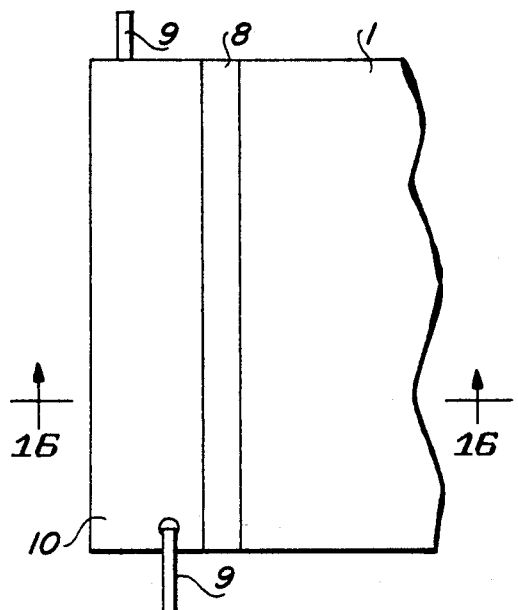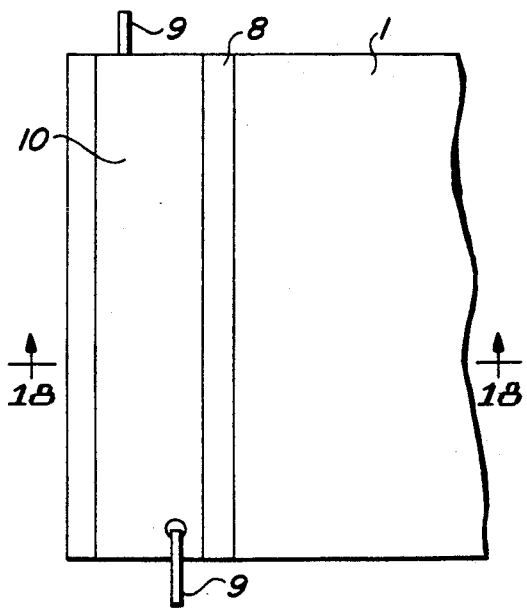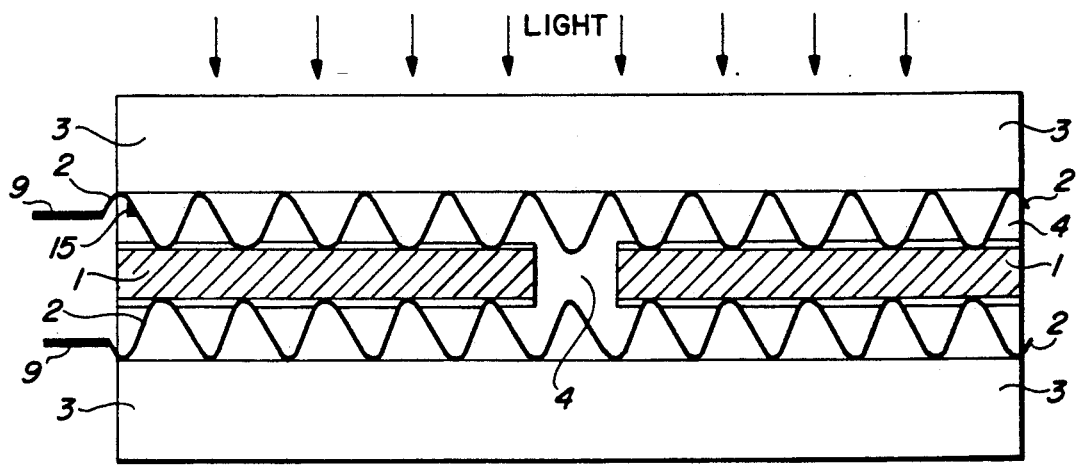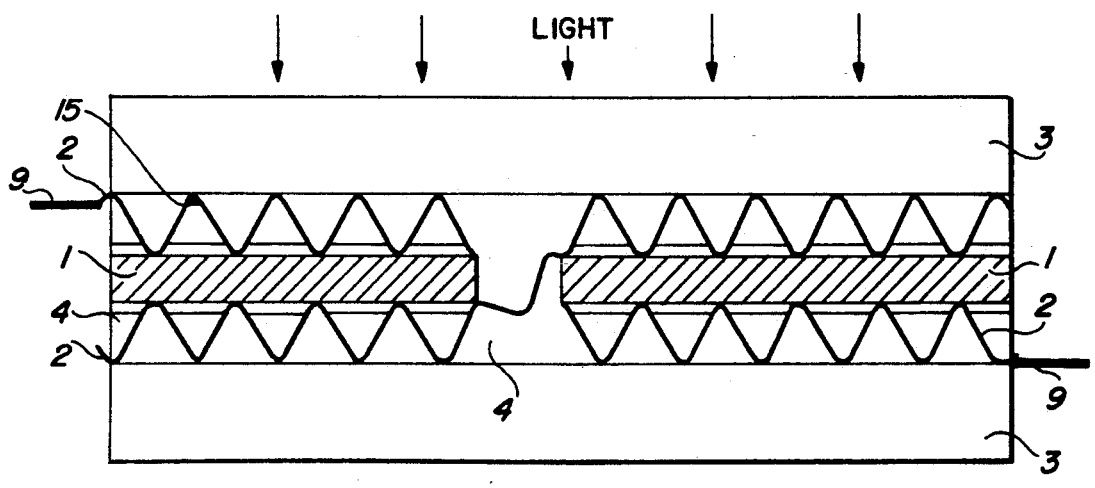

PHOTOVOLTAIC CELLS FOR CONVERTING LIGHT ENERGY TO ELECTRIC ENERGY AND PHOTOELECTRIC BATTERY

BACKGROUND OF THE INVENTION

1. Field of the Invention

The present invention relates to semiconductor electronics and, more particularly, to photovoltaic energetics, and may be used for providing photovoltaic cells.

Devices for converting light energy to electric energy (photoelectric cells) are known, which comprise a barrier-structure semiconductor wafer, conductive current collecting elements arranged on both sides of the wafer, protective coatings as well as current tapping electrodes. Current collecting contacts are one of the construction elements of photovoltaic cells.

2. State of the Art

Present-day photovoltaic cells include current collecting contacts deposited by vacuum evaporation through a mask (cf. A. Fahrenbruch, R. Bube "Solar Elements. Theory and Experiment", Moscow, Energoatomizdat, 1987, p. 169).

The following metals are deposited using vacuum evaporation techniques: aluminum, titanium, palladium, copper, and silver. A copper or silver layer is deposited as the top layer. Following deposition the contacts are coated with lead- and tin-based solder. Thus, the use of vacuum-deposited contacts in photovoltaic cells requires significant amounts of expensive metals and energy.

In U.S. Pat. No. 4,235,644, photovoltaic cells are disclosed, wherein the current collecting contacts are made using a screen-printing technique. A conductive paste containing silver powder as a filler is applied by means of a roller through a mask to the semiconductor wafer surface. After removal of the mask the contacts are fired.

A major drawback of photovoltaic cells having vacuum-deposited or screen-printed contacts is that, in practice, it is not possible to accomplish contact buses less than 0.2 mm in thickness.

The mesh of such contacts deposited on the surface of the semiconductor wafer makes it impossible to provide a surface shadowing area of less than 5 percent of the total area, which is a limiting factor to improving the conversion efficiency of photovoltaic cells. Moreover, when photovoltaic cells containing vacuum-deposited or screen-printed current collecting contacts are used to make batteries, the interconnection of the photovoltaic cells is a complicated and time-consuming task to be performed either manually or using expensive sophisticated equipment.

In U.S. Pat. No. 4,380,112, a photovoltaic cell is disclosed, which comprises a silicon semiconductor wafer having a barrier structure, a continuous metallic contact on the rear side, and a current collecting contact on the front side. The current collecting contact on the front side (i.e. the side oriented towards incident light) is a metallic wire embedded in borosilicate glass and directly contacting the surface of the semiconductor wafer. Since the glass is electrostatically bonded to the surface of the semiconductor wafer and the whole construction is heated to a temperature at which a noticeable diffusion of the wire metal into the semiconductor takes place, a rigid contact is provided between the semiconductor wafer and the current collecting contact.

The disadvantage of such a construction, too, is low conversion efficiency due to a considerable degree of shadowing of the semiconductor wafer surface caused by the wire. Here, too, the shadowing area constitutes at least 5 percent of the total surface area of the semiconductor wafer. Furthermore, this construction is more expensive than the two constructions described above, as borosilicate glass is used, an expensive material which satisfies the requirements of matching the thermomechanical properties of the silicon wafer and the glass cover plate. This construction requires preliminary polishing of the semiconductor wafer and the glass plates and, therefore, cannot be used for constructions in which inexpensive polycrystalline or rough monocrystalline silicon is employed. Elevated temperatures up to 600° C. are required to achieve electrostatic bonding.

Moreover, this construction requires subsequent sealing of the whole photovoltaic cell with a sealant polymer and glass cover plates. Photovoltaic cells of this type are usually interconnected by connecting the wires on the front side and the metallized contacts on the rear side by soldering. This process is rather difficult to automate.

SUMMARY OF THE INVENTION

It is a principal object of the present invention to reduce the shadowing area of the semiconductor wafer surface caused by the current collecting contacts and, thus, to enhance the efficiency of the photovoltaic cell for converting solar energy to electric energy. It is a further object of the invention to provide novel current collecting contacts simplifying the interconnection of both the photovoltaic cells themselves and batteries assembled therefrom, in result of which the above mentioned technique of interconnecting the contacts and the buses by soldering can be abandoned. This will permit automation of the fabrication of photovoltaic cells and of batteries assembled therefrom as well as significantly simplify the fabrication process as a whole and reduce costs.

BRIEF DESCRIPTION OF THE INVENTION

The present invention provides a photovoltaic cell for converting light energy to electric energy, wherein a conductive current collecting element (contact) is provided at least on the front surface of the semiconductor wafer, said current collecting contact comprising electrically connected intermittent sections being, respectively, in and out of contact with the semiconductor wafer surface.

Since part of the current collecting contact is "elevated" above the semiconductor wafer surface and this surface is, therefore, additionally exposed to dissipated solar energy, the overall conversion efficiency of the photovoltaic cell is enhanced.

If the photovoltaic cell has an isotype junction on the rear side of the semiconductor wafer, and the thickness of the semiconductor wafer is comparable to the diffusion length of minor charge carriers, then illumination, e.g. by solar radiation dissipated in the atmosphere, of the rear side of the photovoltaic cell on which also current collecting contacts in accordance with the present invention are arranged, will lead to a further enhanced conversion efficiency.

The construction and the interconnection of the conductive contacts are significantly facilitated, if such a current collecting contact is arranged on both sides of the semiconductor wafer.

The configuration of the current collecting contacts may vary within a broad range.

For instance, the contacts may be in the form of bent wire and the bending may be of various shape and pitch. They may also be configured as a bus with wire sections attached thereto (in the form of a brush). The current collecting contacts may be prepared from a metal sheet as a one- or two-sided comb.

The current collecting contacts do not necessarily have to be planar, they may as well be three-dimensional (e.g., in the form of a cylindrical spring).

Furthermore, the conductive current collecting contacts may be configured as a mesh, e.g. a mesh made of wires, which may optionally be fixed at the crossing points. Fixed wires facilitate the fabrication of photovoltaic cells and batteries assembled therefrom.

The conductive current collecting contacts are embedded in a block of optically transparent polymer material in such a manner that at least the sections thereof which are in contact with the surface of the semiconductor wafer protrude from the polymer block. This provides for a reliable ohmic contact between the current collecting contacts and the semiconductor wafer, since the polymer block is compressed between the protective coatings and the semiconductor wafer, and since the current collecting contacts, due to their elasticity, constantly remain in contact with the surface of the semiconductor wafer.

Optically transparent polymer materials, such as poly-4-vinylbutyral and polyethylene vinylacetate, are commonly used in photovoltaic cells for converting light energy to electric energy (cf. M. M. Koltun "Photovoltaic Elements", Moscow, Nauka, 1987, p. 163).

In order to provide for constant contact and a reliable bond between the polymer block, the protective coatings and the semiconductor wafer, a layer of an optically transparent adhesive is applied to the upper and the lower side of the polymer block containing the current collecting contacts. Under heat and pressure such an adhesive attaches to the surfaces of the protective coating and the silicon wafer to form a tight bond.

In a preferred embodiment, the whole polymer block is made of such an optically transparent adhesive polymer or polymerizable material. Adhesives such as poly-4-vinylbutyral and polyethylene vinylacetate are known and commonly used in practice for the manufacture of photovoltaic cells to provide for reliable strength and stability of the whole device.

In order to enhance efficiency and to reduce resistance at the points of contact between the current collecting contacts and the surface of the semiconductor wafer, the semiconductor wafer is coated either on the front side or on both sides (unless the rear side contact is a metallic continuum) with an antireflective conducting material. Such materials, e.g. materials on the basis of SnOx and InOx, are known and widely used in practice in the fabrication of photovoltaic cells.

In another preferred embodiment, the rear side of the semiconductor wafer has an isotype junction similar to that of the semiconductor wafer. In that case, series resistance is reduced, less metal is required, and efficiency is enhanced.

The current collecting contacts extend over the whole surface of the semiconductor wafer.

In order to provide a reliable and simple interconnection of adjacent photovoltaic cells, a dielectric wafer is used which is arranged at least on one edge of the semiconductor wafer, thus, for example, forming an air gap, or a dielectric spacer is arranged between the dielectric wafer and the semiconductor wafer. This dielectric wafer is coated on both sides with a conducting material to which the current tapping electrodes are connected. The dielectric wafer is coplanar with the semiconductor wafer and located between the polymer blocks, in which the current collecting contacts are arranged, and provides for reliable contact with the current collecting contacts due to the elasticity of the current collecting contacts and the compression force exerted by the protective coatings.

In the most preferred embodiment, the dielectric wafer covered with a conducting coating is configured as a frame coplanarly arranged around the semiconductor wafer and forming an air gap. A dielectric spacer may be arranged in the gap. In that case no additional conductive buses are required for connecting the current collecting contacts. As a result, the construction is significantly simplified and its reliability increased.

The configuration of the current collecting contacts in accordance with the present invention and the configuration of the interconnection elements based thereon significantly simplifies the assembly of photovoltaic cells into a battery.

Parallel interconnection of at least two photovoltaic cells can be provided by electrically connecting the conductive current collecting contacts arranged on the front side of the semiconductor wafer of one photovoltaic cell to the contacts arranged on the front side of the semiconductor wafer of the adjacent photovoltaic cell and, respectively, connecting the contacts arranged on the rear side of the semiconductor wafer of said first cell with the contacts arranged on the rear side of the semiconductor wafer of the second cell. The free ends of the current collecting contacts of both photovoltaic cells are connected to the corresponding current tapping electrodes.

In the case of serial interconnection of at least two photovoltaic cells to form a battery, the current collecting contacts arranged on the rear side of the semiconductor wafer of one cell are electrically connected to the current collecting contacts arranged on the front side of the semiconductor wafer of the adjacent cell, and the current collecting contacts arranged on the front side of the semiconductor wafer of the first cell and the current collecting contacts arranged on the rear side of the semiconductor wafer of the second cell are connected to the corresponding current tapping electrodes.

During fabrication of the photovoltaic cell the current collecting contacts may be manufactured as a separate construction element of the photovoltaic cell. For this purpose, they may be arranged, for example, coplanarly in the form of wires, spirals or meshes of the above described configurations and subsequently be embedded in the optically transparent polymer block at the softening temperature of the polymer, or a polymerizable compound may be cast around them, followed by hardening, with the contacts protruding from the polymer block at least on one side. The polymer block thus obtained, in which the current collecting contacts are embedded, may be rigid or flexible, e.g., may have the form of a long continuous ribbon. The current collecting contacts may be arranged in an arbitrary manner relative to the longitudinal axis of the ribbon, i.e. they may be arranged, for example, parallel or angularly to any pair of sides of the photovoltaic cell. The fabricated ribbon may be cut into sections of a size sufficient to provide for optimum interconnection of photovoltaic cells. To this end, a polymer ribbon with conductive contacts embedded therein is deposited on the surface of the rearside protective coating (e.g. glass), then the dielectric frames having conducting coatings are superimposed, the barrier-structure silicon wafers having an antireflective coating are arranged within said frames, and, on top thereof, a polymer ribbon with conductive contacts embedded therein and the front side protective coating are sequentially deposited. The multilayer structure thus obtained is placed in a chamber which is evacuated to $10^{-1}$ Torr, then heated (to the polymer flow temperature) and mechanically compressed. In the air-free atmosphere, the molten polymer fills any cavities of the photovoltaic cell and makes all components stick together. At the same time, (due to proper arrangement of the dielectric frames, the silicon wafers and the polymer ribbons with the current collecting contacts embedded therein) interconnection of individual photovoltaic cells to form a photobattery is provided.

BRIEF DESCRIPTION OF THE DRAWINGS

For a fuller understanding of the nature and objects of the present invention, reference is to be made to the following detailed description, which is to be taken in connection with the accompanying drawings, wherein:

FIG. 15 is a schematic plan view of a dielectric wafer contacting a semiconductor wafer, with conducting coatings being applied to both sides of the dielectric wafer at some distance from the inner edge of the wafer.

FIG. 17 is schematic plan view of a dielectric wafer according to FIG. 15 to which conducting coatings have been applied at some distance from both the inner and the outer edges of the wafer.

FIG. 19 is an illustration of a battery composed of two parallel interconnected photovoltaic cells.

FIG. 20 is an illustration of a battery composed of two serially interconnected photovoltaic cells.

DETAILED DESCRIPTION OF THE INVENTION

Figure 1:
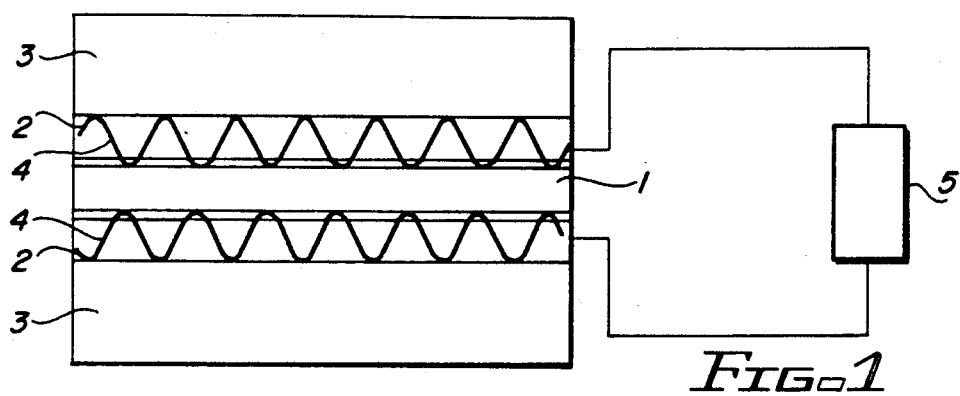
FIG. 1 is a schematic view of a photovoltaic cell containing current collecting contacts in accordance with the present invention.
Figure 2:
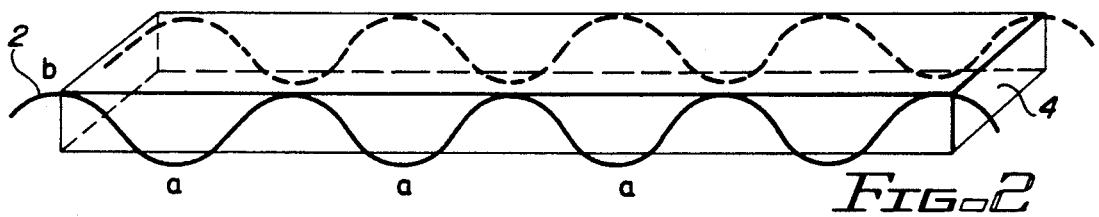
FIG. 2 is a schematic view of current collecting contacts arranged in the optically transparent polymer block, where "a" denotes the sections which are in contact with the surface of the semiconductor wafer and "b" denotes the sections which are not in contact with the surface of the semiconductor wafer.
Figure 3A:
FIGS. 3a-3j are illustrations of various embodiments of a current collecting contact made of bent wire.
Figure 3F:
Figure 3B:
Figure 3G:
Figure 3C:
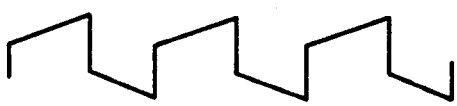
Figure 3H:
Figure 3D:
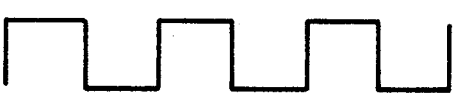
Figure 3I:
Figure 3E:
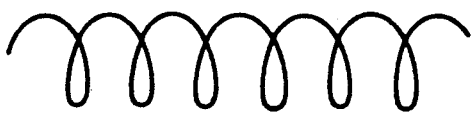
Figure 3J:

A photovoltaic cell for converting light energy to electric energy in accordance with the present invention comprises a barrier-layer semiconductor wafer 1 and current collecting contacts 2 made of conducting metals or alloys. The current collecting contacts are configured as electrically connected intermittent sections being, respectively, in (a) and out (b) of contact with semiconductor wafer 1 (FIG. 2). In order to fix the current collecting contacts they are embedded in an optically transparent polymer block 4 in such a way that at least the sections which are in contact with the semiconductor wafer surface protrude from the polymer block. From above and from below the current collecting contacts are compressed by optically transparent protective coatings 3. Glass coatings or flexible coatings, e.g. Lawsan coatings, are used as the protective coatings.

Due to the compression forces generated by protective coatings 3, current collecting contacts 2 are in a state of tension and, by virtue of their elasticity, remain constantly in contact with the semiconductor wafer surface at the contact points.

Upon illumination of the front side of the photovoltaic cell, charge separation occurs at the energetic barrier, and electromotive force is generated. As a result, current flows through current collecting contacts 2 arranged on the front side (the side oriented towards incident light) and on the rear side (the shadowed side) of semiconductor wafer 1, which leads to power generation on load resistor 5. Contact resistance at the points of contact between current collecting contacts 2 and semiconductor wafer 1 is rather low due to the compression forces generated by protective coatings 3 and because of the elasticity of the current collecting contacts themselves.

In the photovoltaic cell in accordance with the present invention, 10 percent or less of the projection area of current collecting contacts 2 on the surface of wafer 1 is in direct contact with photosensitive semiconductor wafer 1.

This means that the remaining 90 percent of the wire projection area is also illuminated, though not by perpendicular light beams. This additional illumination of the surface of photosensitive semiconductor wafer 1 leads to a higher conversion efficiency of the photovoltaic cell as a whole.

The configuration of current collecting contacts 2 as claimed herein significantly simplifies their fabrication as the step of embedding current collecting elements 2 in optically transparent polymer block 4 is performed separately, and polymer blocks 4 with contacts, 2 embedded therein are then used in the step of assembling photovoltaic cells and interconnecting them to form batteries. Contact between current collecting contacts 2 and the surface of semiconductor wafer 1 as well as interconnection and sealing of the photovoltaic cell are provided in one single step by heating the assembled cell up to a temperature of about 100° to 120° C. and applying external pressure of up to 1 atm.

Current collecting contacts 2 may be made of conducting bent wire. The wire may be bent periodically or aperiodically in the form of a sinusoid, a triangle, a trapazoid, a rectangle, or a flat helix, as well as various combinations of these geometric figures (FIGS. 3a-3j). The wire bending may be completely arbitrary.

Figure 6A:
FIGS. 6a-6c are illustrations of current collecting contacts configured as a "brush".
Figure 6B:
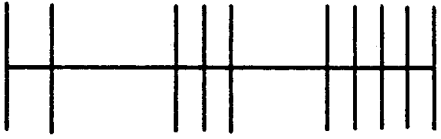
Figure 5C:
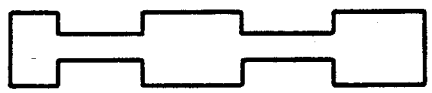
Figure 5D:
Figure 6C:

The current collecting contacts may also be configured as a bus having wire sections attached thereto, with the lower free ends of said wire sections contacting the surface of the semiconductor wafer (in the form a "brush") (FIGS. 6a and 6c). The brush pitch is of no importance whatsoever.

Wire sections may also be arranged on both sides of one common bus (FIG. 6b).

Figure 4:
FIG. 4 is an illustration of a current collecting contact configured as a cylindrical helix.
Figure 5A:
FIGS. 5a-5d are illustrations of various embodiments of current collecting contacts made of metal sheet with protrusions and depressions.
Figure 5B:

Furthermore, the current collecting contacts may be configured as a cylindrical helix (FIG. 4) or made of a metal sheet with protrusions and depressions (FIG. 5). The position of these protrusions and depressions relative to each other as well as their shape are of no particular importance. What is important is that due to the state of tension and the elasticity of current collecting contacts 2 a reliable contact be provided between these contacts and the surface of semiconductor wafer 1.

In the photovoltaic cell, current collecting contacts 2 arranged on each of the two sides of semiconductor wafer 1 may either be of the same type, e.g. configured as bent wire, or represent various combinations of contacts 2, such as bent wire—cylindrical helix—comb—brush.

Figure 7:
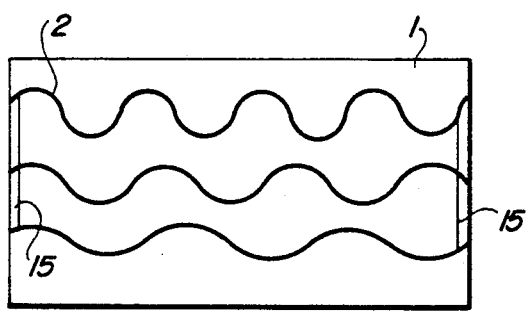
FIG. 7 is a schematic plan view of the semiconductor wafer having current collecting contacts arranged parallel to one pair of sides of the semiconductor wafer.
Figure 8:
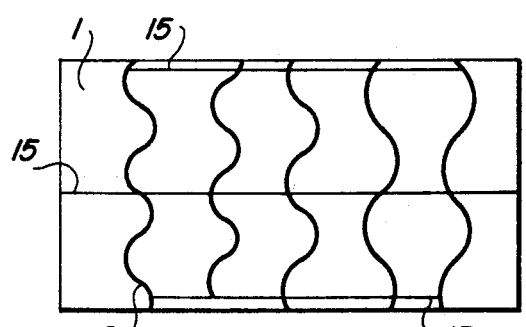
FIG. 8 is a schematic plan view of a semiconductor wafer having current collecting contacts arranged parallel to the other pair of sides of the semiconductor wafer.
Figure 9:
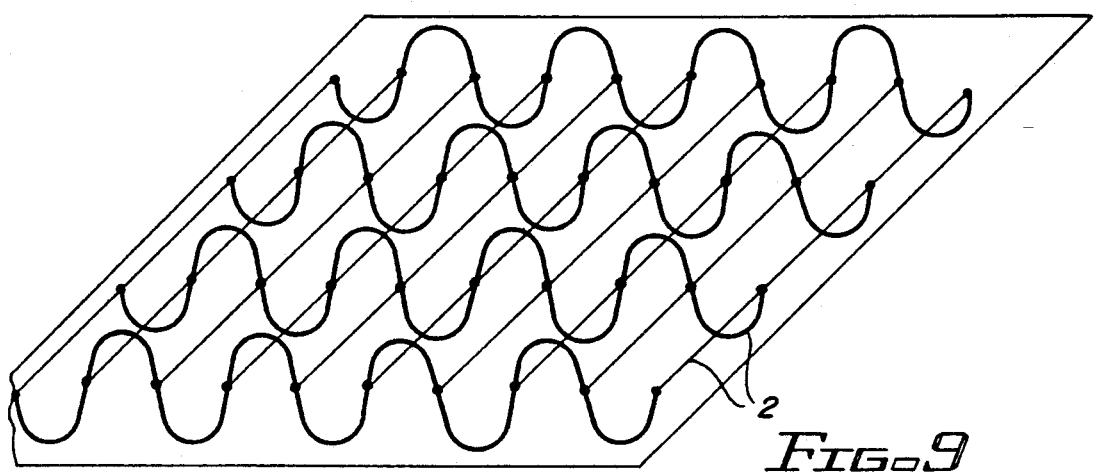
FIG. 9 is a schematic plan view of a semiconductor wafer with current collecting contacts configured as a mesh.

Current collecting contacts 2 may be arranged either coaxially to the longitudinal axis of semiconductor wafer 1 (FIG. 7) or perpendicularly thereto (FIG. 8), i.e., parallel to one pair of sides of the semiconductor wafer, as well as, for example, be arranged coaxially or perpendicularly to the longitudinal axis of the semiconductor wafer on the front side, and in reverse on the rear side, i.e. parallelly to different pairs of sides of the semiconductor wafer. In addition, the current collecting element may be configured as a mesh. This mesh may comprise various current collecting contacts, such as wires, helixes, planar elements, "brushes", etc. An example of a mesh design composed of bent and straight wires is shown in FIG. 9. The wires optionally may be fixed to each other at the crossing points. If they are connected at the crossing points, this leads to enhanced mechanical strength, lower series resistance and a simplified assembly technique.

Figure 10:
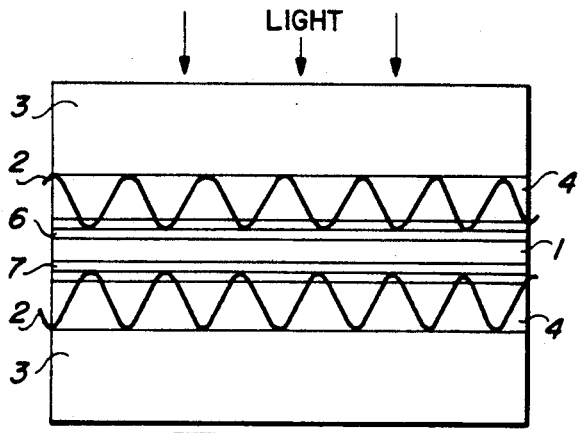
FIG. 10 is schematic view of a photovoltaic cell having conducting strata on the front and the rear side of the semiconductor wafer.
Figure 13:
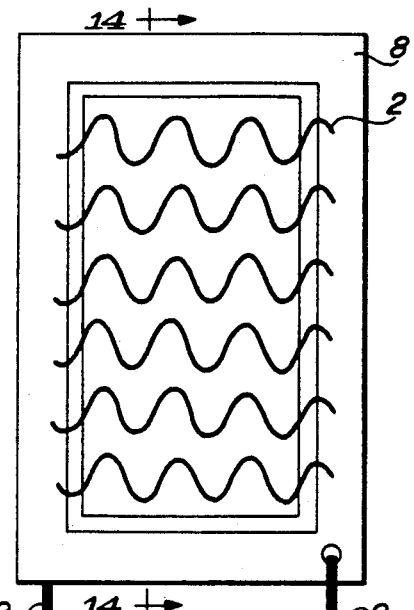
FIG. 13 is a plan view of a semiconductor wafer and a dielectric wafer configured as a frame.
Figure 11:
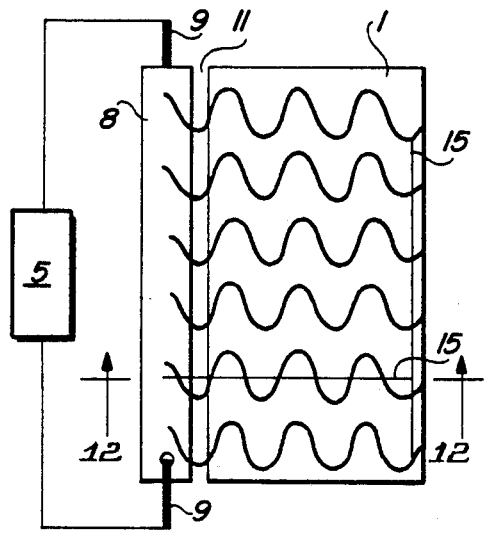
FIG. 11 is a plan view of a semiconductor wafer and a dielectric wafer arranged at one edge of the semiconductor wafer.

Contact resistance at the points of contact between current collecting contacts 2 and the surface of semiconductor wafer 1 is significantly reduced, if at least the front surface of the semiconductor wafer is coated with an antireflective conducting coating 6 and 7 (FIG. 10) characterized by a high concentration of charge carriers (more than $10^{20}/cm^{-3}$). This antireflective conducting coating may be selected from known materials which are commonly used in constructions of photovoltaic cells. If illumination of the rear side of the photovoltaic cell is possible, it is advisable to apply the antireflective coating to both sides of the semiconductor wafer, as this enhances the efficiency of the photovoltaic cell.

In constructions of photovoltaic cells where only the front surface of semiconductor wafer 1 is exposed to incident light energy, it is recommended to provide on the rear side of semiconductor wafer 1 a highly-doped near-surface layer having the same type of conductivity as semiconductor wafer 1, or to deposit a metal layer, to provide for low contact resistance between the current collecting contact and the semiconductor wafer. This will lead to lower contact resistance and higher open-circuit voltage of the photovoltaic cell and, consequently, to enhanced efficiency.

Figure 14:
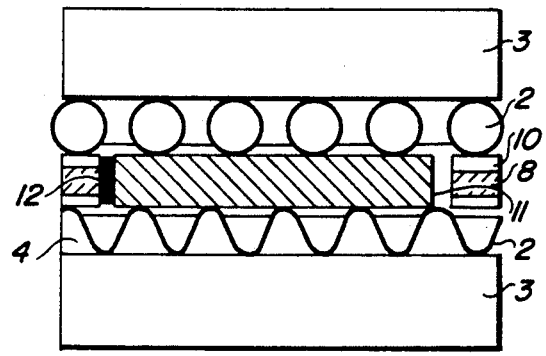
FIG. 14 is a cross section corresponding to line 14—14 in FIG. 13.
Figure 12:
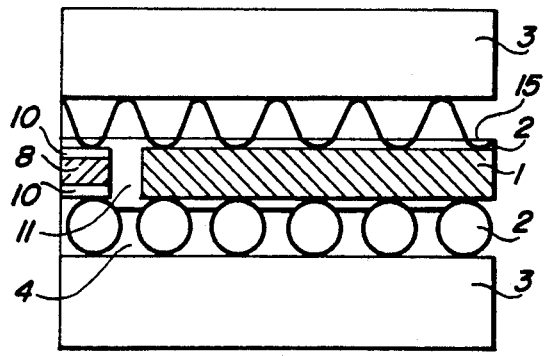
FIG. 12 is a sectional view corresponding to line 12—12 in FIG. 11.
Figure 16:
FIG. 16 is a cross section corresponding to line 16—16 in FIG. 15.
Figure 18:
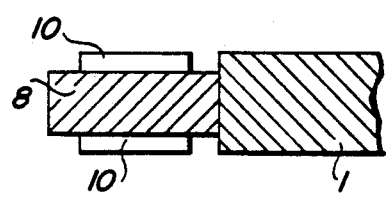
FIG. 18 is a cross section corresponding to line 18—18 in FIG. 17.

The proposed construction of current collecting contacts 2 makes it, possible to significantly similify the interconnection of contacts and to eliminate the time-consuming soldering process which is difficult to automate. To facilitate interconnection of contacts, a dielectric wafer 8 is provided in the photovoltaic cell (FIGS. 11-14), said wafer being arranged coplanarly with semiconductor wafer 1 and at least at one edge of the latter. Dielectric wafer 8 is coated on both ides with a layer of conducting material 10 to which current tapping electrodes 9 are connected, e.g., by soldering. Dielectric wafer 8 is arranged to form an air gap 11 relative to semiconductor 1. A dielectric spacer element 12 may be arranged between dielectric wafer 8 and semiconductor wafer 1 (FIG. 14). To prevent electric contact between conducting coating 10 of dielectric wafer 8 and semiconductor wafer 1, the conducting coating 10 may be applied to dielectric wafer 8 at some distance from the edge (FIGS. 15-18).

Current collecting contacts 2 arranged on the front side and the rear side of semiconductor wafer 1 are applied, respectively, to each of the two sides of dielectric wafer 8, and pressed against conducting material 10 due to the compression force generated by protective coatings 3 and their own elasticity. The photovoltaic cell is connected to load resistor 5 via current tapping electrodes 9. Since the thickness of the dielectric wafer preferably is equal to or somewhat greater than the thickness of the semiconductor wafer, current collecting contacts 2, due to their elasticity, maintain constant contact with conducting coating 10 of dielectric wafer 8. Rather low contact resistance between current collecting contacts 2 and conducting coating 10 is provided as a result of using a material having a high concentration of charge carriers (more than $10^{20}/cm^{-3}$) and low sheet resistance (less than $10^{-1}$ ohm/☐), e.g. a metal, as the conducting coating. If one dielectric wafer 8 is used, current collecting contacts 2 are interconnected via a bus on the opposite edge or, if a mesh is used, on the other three edges of the dielectric wafer.

A preferred embodiment of the interconnection element (FIG. 13, 14) is a dielectric frame 8 within which semiconductor wafer 1 is arranged, which is separated from said frame by an air gap 11 or a dielectric spacer element 12. In that case, dielectric frame 8 is also covered on both sides with conducting coating 10 to which current collecting contacts 2 are applied. Here, too, as described above, it is possible that the dielectric wafer is not completely covered with conducting coating 10 (FIGS. 15-18). This construction, which has all the advantages mentioned above for the above described construction where a dielectric wafer is arranged at one edge of the semiconductor wafer, makes it possible to completely abandon the soldering process and automate the fabrication of both, individual photovoltaic elements and batteries assembled therefrom. This is accomplished by forming a number of openings in a dielectric wafer 8 covered on both sides with conducting coatings, in which openings semiconductor wafers 1 covered with antireflective coating 6 and conducting coating 7 are inserted The prefabricated ribbons of optically transparent polymer material 4 with current collecting contacts 2 embedded therein are applied from above and from below to semiconductor wafer 1. Polymer ribbons 4 can be made of optically transparent adhesive sealant material or may be coated from above and from below with a layer of such material. From above, protective coatings 3 are applied to polymer material 4, which protective coatings are either of glass or, for example, of Lawsan, which provides for a flexible protective coating.

Upon assembly, the whole construction of the photovoltaic cell is heated up to the flow temperature of the polymer (about 100°-120° C.). Due to the application of external pressure (up to 1 atm) the polymer flows from the zones where semiconductor wafer 1 and dielectric wafer 2 are located into the gap between them or in any technological gaps between them. Since temperature and pressure are relatively low, semiconductor wafer 1 and dielectric wafer 8 do not move apart from each other. During heating and compression, protective coating 3 and semiconductor wafer 1 are adhesively bonded to the adhesive sealant polymer which has been applied to polymer block 4 or of which polymer block 4 is made.

Photovoltaic cells in accordance with the present invention are employed for assembling batteries.

Any type of interconnection, both serial and parallel, can easily be provided.

Parallel interconnection of two photovoltaic cells is schematically shown in FIG. 19. In that case, current collecting contacts 2 arranged on the front side of semiconductor wafer 1 of the first photovoltaic cell are electrically connected to current collecting contacts 2 arranged on the front side of semiconductor wafer 1 of the other photovoltaic cell, and the current collecting contacts arranged on the rear side of the two semiconductor wafers are connected correspondingly. The free ends of current collecting contacts 2 of both photovoltaic cells are connected to the corresponding current tapping electrodes 9.

In the case of serial interconnection (FIG. 20) of photovoltaic cells, current collecting contacts 2 arranged on the rear side of semiconductor wafer 1 of the first photovoltaic cell are electrically connected to current collecting contacts 2 arranged on the front side of semiconductor wafer 1 of the adjacent photovoltaic cell, and the current collecting contacts 2 arranged on the front side of semiconductor wafer 1 of the first photovoltaic cell and the current collecting contacts 2 arranged on the rear side of semiconductor wafer 1 of the second photovoltaic cell are connected to the corresponding current tapping electrodes 9. This connection is schematically shown in FIG. 20.

In order to reduce resistivity of current collecting contacts 2, a metallic conductor 15 may be provided in the constructions according to FIGS. 7, 8, 11, 12, 19 and 20, which conductor may be configured as a wire or a metallized dielectric of any shape, which electrically contacts current collecting contacts 2. This conductor 15 may be arranged either in the surface area or near the edges of silicon wafer 1 and may electrically contact metallized dielectric frame 8. In the embodiment according to FIG. 11 and 12, two conductors 15 are fixed to each other at the crossing point, and one of the conductors 15 is connected to metallized dielectric wafer 8.

Possible varieties of serial interconnection of photovoltaic cells to form a battery are shown in FIG. 21 (a, b, c, d). In the embodiment according to FIG. 21a, serial interconnection of photovoltaic cells is accomplished by providing a system of cuttings, holes and jumpers 13 in dielectric wafers 8 covered by metallized coating 10, by means of which system the metallized coatings are interconnected.

Figure 21A:
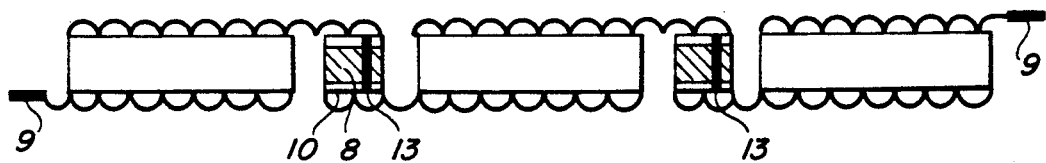
FIGS. 21a-21d are illustrations of various types of serial interconnection of photovoltaic cells to form a battery in accordance with the present invention.
Figure 21B:
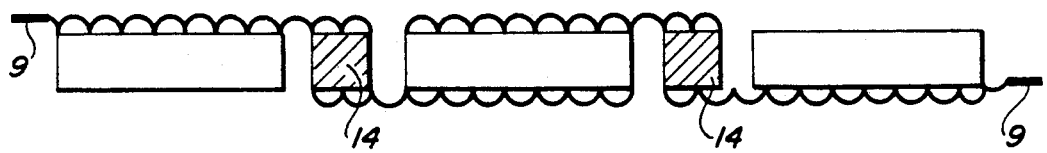

A continuous metal wafer 14 can be used instead of the dielectric wafer, by means of which the front side and the rear side of two serially interconnected photovoltaic cells are connected (FIG. 21b).

Figure 21C:
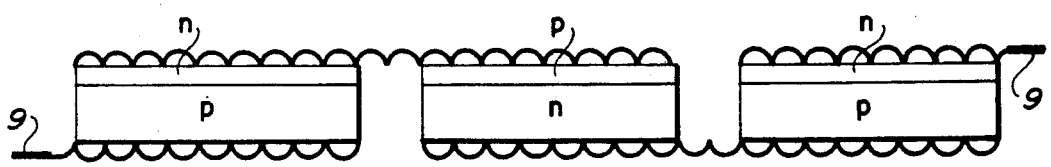
Figure 21D:
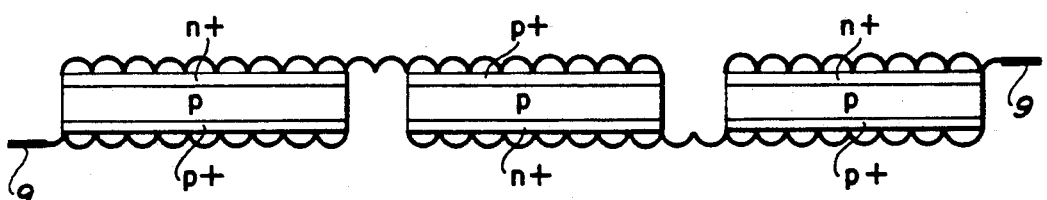

FIG. 21c shows a battery composed of photovoltaic cells, wherein the basic semiconductors have various types of conductivity. FIG. 21d shows a battery assembled from serially interconnected photovoltaic cells having the same type of conductivity and such a rear side sensitivity that upon illumination of the rear side, the efficiency of this photovoltaic cell differs little from its efficiency in the case of illumination of the front side.

In the case of parallel interconnection as well as in the case of serial interconnection of photovoltaic cells to form a battery, the contact systems of the photovoltaic cells can be brought out and interconnected. Constructions of photovoltaic cells in accordance with the present invention have been realized using various materials and tested in comparison with photovoltaic cells fabricated using known techniques.

Tests have shown that a photovoltaic cell in accordance with the present invention, when illuminated at 1000 W/m$^2$, has an efficiency of 16 to 18 percent as compared to known photovoltaic cells, which have an efficiency of 12 percent.

Photovoltaic cells in accordance with the invention were operated for 60 days at a temperature of 80° C. without any change in efficiency, which corresponds to 10 years of operation at room temperature.

What is claimed is:

1. A photovoltaic cell for converting light energy to electric energy comprising a photosensitive barrier-structure semiconductor wafer, an antireflective electrically conductive coating deposited at least on the front surface of said semiconductor wafer, electrically conductive current collecting contacts arranged on at least said front surface of said semiconductor wafer in contact with said conductive coating, protective coatings arranged on both sides of said semiconductor wafer, wherein at least said conductive current collecting contacts arranged on the front surface of said semiconductor wafer are configured as electrically connected intermittent sections being, respectively, in and out of contact with said front surface of said semiconductor wafer.

2. The photovoltaic cell according to claim 1, wherein said intermittent conductive current collecting contacts are arranged on the front and rear surfaces of said photosensitive semiconductor wafer.

3. The photovoltaic cell according to claim 2, wherein said conductive current collecting contacts are configured as at least one bent wire.

4. The photovoltaic cell according to claim 2, wherein said conductive current collecting contacts are configured as a cylindrical spring.

5. The photovoltaic cell according to claim 2, wherein said conductive current collecting contacts are made of a metal sheet configured as a comb having protrusions and depressions.

6. The photovoltaic cell according to claim 2, wherein said conductive current collecting contacts are configured as a brush comprising a conductive bus and wire sections attached thereto.

7. The photovoltaic cell according to claim 2, wherein a metal layer is applied to the rear side of said semiconductor wafer, with said conductive current collecting contacts contacting said metal layer.

8. The photovoltaic cell according to claim 2, wherein a highly-doped layer having the same type of conductivity as said semiconductor wafer is applied to the rear side of said semiconductor wafer, with said conductive current collecting contacts contacting said highly-doped layer.

9. The photovoltaic cell according to claim 2, wherein said conductive current collecting contacts extend over entire front and rear surfaces of said semiconductor wafer.

10. The photovoltaic cell according to claim 2, wherein said conductive current collecting contacts extend over the entire front and rear surfaces of said semiconductor wafer parallel to one pair of sides of said semiconductor wafer.

11. The photovoltaic cell according to claim 2, wherein said conductive current collecting contacts are arranged as a mesh on the front and rear surfaces of said semiconductor wafer.

12. A battery comprising at least two parallel interconnected photovoltaic elements according to claim 2, wherein said conductive current collecting contacts arranged on the front surface of said semiconductor wafer of the first photovoltaic element are electrically connected to said conductive current collecting contacts arranged on the front surface of said semiconductor wafer of an adjacent photovoltaic cell, and said conductive current collecting contacts arranged on the rear surface of said semiconductor wafer of said first photovoltaic cell are electrically connected to said contacts arranged on the rear surface of semiconductor wafer of said adjacent photovoltaic cell, with the free ends of said conductive current collecting contacts of both photovoltaic cells being connected to corresponding current tapping electrodes.

13. A battery comprising at least two serially interconnected photovoltaic cells according to claim 2, wherein said conductive current collecting contacts arranged on the rear surface of said semiconductor wafer of the first photovoltaic cell are electrically connected to said conductive current collecting contacts arranged on the front surface of said semiconductor wafer of an adjacent photovoltaic cell, with said current collecting contacts arranged on the front surface of said semiconductor wafer of the first photovoltaic cell and said current collecting contacts arranged on the rear surface of said semiconductor wafer of the second photovoltaic cell being connected to corresponding current tapping electrodes.

14. The photovoltaic cell according to claim 1, wherein said conductive current collecting contacts are fixed in a block of optically transparent polymer material in such a manner that at least sections of current collecting contacts, which contact said semiconductor wafer, protrude from said block of polymer material.

15. The photovoltaic cell according to claim 14, wherein a layer of an adhesive polymer composite is applied to the upper and the lower surface of said polymer block.

16. The photovoltaic cell according to claim 14, wherein optically transparent adhesive polymer composites are employed as the polymer material of said block, in which said conductive current collecting contacts are embedded.

17. The photovoltaic cell according to claim 1, wherein a dielectric wafer is arranged coplanarly at least on one edge of said semiconductor wafer to form a dielectric gap relative to the latter, said dielectric wafer being covered on the lower and the upper side with conducting coatings to which current tapping electrodes are connected, with said conductive current collecting contacts electrically contacting said coatings.

18. The photovoltaic cell according to claim 17, wherein said dielectric wafer is configured as a frame coplanarly arranged around said semiconductor wafer to form a dielectric gap relative to the latter.

19. The photovoltaic cell according to claim 1 which has at least one first electric conductor which is connected to said conductive current collecting contacts.

20. The photovoltaic cell according to claim 19 which has at least one second electric conductor which crosses said first electric conductor and is fixed to said first electric conductor at the crossing point.

21. The photovoltaic cell according to claim 20, wherein at least one of the two conductors is connected to metallized dielectric wafer.

* * * * *